(12) United States Patent
Moon et al.

(10) Patent No.: US 9,172,060 B2
(45) Date of Patent: Oct. 27, 2015

(54) ORGANIC LIGHT-EMITTING DISPLAY AND METHOD OF MANUFACTURING THE SAME

(71) Applicant: Samsung Display Co., Ltd., Yongin, Gyenonggi-Do (KR)

(72) Inventors: Sang-Ho Moon, Yongin (KR); Joon-Hoo Choi, Yongin (KR); Kyu-Sik Cho, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/216,043

(22) Filed: Mar. 17, 2014

(65) Prior Publication Data

US 2014/0199797 A1    Jul. 17, 2014

Related U.S. Application Data

(62) Division of application No. 13/333,846, filed on Dec. 21, 2011, now Pat. No. 8,710,527.

(30) Foreign Application Priority Data

Aug. 9, 2011 (KR) .................. 10-2011-0079148

(51) Int. Cl.
*H01L 21/00* (2006.01)
*H01L 51/40* (2006.01)
(Continued)

(52) U.S. Cl.
CPC ........ *H01L 51/5268* (2013.01); *H01L 27/1218* (2013.01); *H01L 51/5275* (2013.01); *H01L 51/5284* (2013.01); *H01L 51/56* (2013.01); *H01L 27/3244* (2013.01)

(58) Field of Classification Search
CPC . H01L 51/5268; H01L 51/56; H01L 27/1218; H01L 51/5275; H01L 51/5284; H01L 27/3244
USPC ............ 257/40, 88, 89, 79, 98, E51.018, 257/E51.021; 438/29, 31, 32, 34, 99; 313/504, 506
See application file for complete search history.

(56) References Cited

U.S. PATENT DOCUMENTS

| | | | |
|---|---|---|---|
| 2001/0035713 A1 | 11/2001 | Kimura | |
| 2005/0116619 A1* | 6/2005 | Kuma et al. | .................. 313/503 |
| 2006/0175961 A1 | 8/2006 | Choong | |
| 2006/0186802 A1* | 8/2006 | Cok et al. | ...................... 313/506 |
| 2007/0096642 A1 | 5/2007 | Lee et al. | |

(Continued)

FOREIGN PATENT DOCUMENTS

KR    10-2007-0069697 A    7/2007
KR    10-2009-0120698 A    11/2009

*Primary Examiner* — Fernando L Toledo
*Assistant Examiner* — Aaron Gray
(74) *Attorney, Agent, or Firm* — Knobbe Martens Olson & Bear LLP

(57) ABSTRACT

An organic light-emitting display and a method of manufacturing the organic light-emitting display are disclosed. In one embodiment, the organic light-emitting display includes: i) a pixel electrode disposed on a substrate, ii) an opposite electrode disposed opposite to the pixel electrode, iii) an organic emission layer disposed between the pixel electrode and the opposite electrode; a light-scattering portion disposed between the substrate and the organic emission layer, including a plurality of scattering patterns for scattering light emitted from the organic emission layer in insulating layers having different refractive indexes. The display may further include a plurality of light absorption portions disposed between the light-scattering portion and the organic emission layer to correspond to the scattering patterns.

3 Claims, 6 Drawing Sheets

(51) Int. Cl.
*H01L 51/00* (2006.01)
*H01L 29/18* (2006.01)
*H01L 33/00* (2010.01)
*H01L 29/08* (2006.01)
*H01L 51/52* (2006.01)
*H01L 27/12* (2006.01)
*H01L 51/56* (2006.01)
*H01L 27/32* (2006.01)

(56) References Cited

U.S. PATENT DOCUMENTS

| | | |
|---|---|---|
| 2008/0042154 A1 | 2/2008 | Wano |
| 2008/0237585 A1 | 10/2008 | Kim |
| 2008/0238308 A1 | 10/2008 | So |
| 2008/0309224 A1 | 12/2008 | Kwak et al. |
| 2009/0015757 A1 | 1/2009 | Potts et al. |
| 2011/0215305 A1 | 9/2011 | Kim et al. |

* cited by examiner

ORGANIC LIGHT-EMITTING DISPLAY AND METHOD OF MANUFACTURING THE SAME

CROSS-REFERENCE TO RELATED PATENT APPLICATIONS

This application is a divisional of U.S. patent application Ser. No. 13/333,846, filed Dec. 21, 2011, which claims the benefit of Korean Patent Application No. 10-2011-0079148, filed on Aug. 9, 2011, in the Korean Intellectual Property Office, the disclosures of which are incorporated herein by reference in their entireties. Any and all applications for which a foreign or domestic priority claim is identified in the Application Data Sheet as filed with the present application are hereby incorporated by reference under 37 CFR 1.57.

BACKGROUND

1. Field

The described technology generally relates to an organic light-emitting display and a method of manufacturing the same.

2. Description of the Related Technology

Organic light-emitting displays are attracting attention as next generation displays because they are not only driven at a low voltage, are light and thin, and have wide viewing angles and excellent contrast, but also have quick response times.

SUMMARY OF CERTAIN INVENTIVE ASPECTS

One inventive aspect is an organic light-emitting display that is manufactured using a simple process and has a reduced color shift according to a viewing angle, and a method of manufacturing the organic light-emitting display.

Another aspect is an organic light-emitting display that is manufactured using a simple process and has an improved color shift according to a viewing angle by applying a resonance structure including a plurality of scattering patterns, and a method of manufacturing the organic light-emitting display.

Another aspect is an organic light-emitting display including: a pixel electrode disposed on a substrate; an opposite electrode disposed opposite to the pixel electrode; an organic emission layer disposed between the pixel electrode and the opposite electrode; a light-scattering portion disposed between the substrate and the organic emission layer, including a plurality of scattering patterns for scattering light emitted from the organic emission layer in insulating layers having different refractive indexes; and a plurality of light absorption portions disposed between the light-scattering portion and the organic emission layer to correspond to the scattering patterns.

Each of the light absorption portions may include a semiconductor material.

The plurality of insulating layers included in the light-scattering portion may include at least a single pair of high and low refractive index layers.

The high refractive index layer may include silicon nitride, and the low refractive index layer comprises silicon oxide.

The scattering patterns may be formed in the high refractive index layer.

The plurality of scattering patterns may be spaced apart from one another.

The plurality of scattering patterns may be spaced apart from one another at constant intervals.

Each of the scattering patterns may be patterned to have a circular shape.

The organic light-emitting display apparatus may further include an insulating layer disposed on the light-scattering portions to cover the light absorption portions.

The insulating layer covering the light absorption portions may include at least a single pair of high and low refractive index layers.

The high refractive index layer comprises silicon nitride, and the low refractive index layer may include silicon oxide.

The organic light-emitting display apparatus may further include a thin film transistor disposed on the substrate to be spaced laterally with respect to the pixel electrode and including an active layer, a gate electrode, and source and drain electrodes; and a capacitor including upper and lower electrodes.

The active layer of the thin film transistor may include the same material as the light absorption portions.

The lower electrode of the capacitor may include the same material as the light absorption portions.

The insulating layer covering the light absorption portions may be disposed to extend between the active layer and the gate electrode and between the lower electrode and the upper electrode.

The light-scattering portion may be disposed to extend under the active layer and the lower electrode.

The scattering patterns included in the light-scattering portion may be disposed only in an area corresponding to the pixel electrode.

Another aspect is a method of manufacturing an organic light-emitting display, the method including: forming a plurality of insulating layers including at least a single pair of high and low refractive index layers on a substrate and including a high refractive index layer at the uppermost position thereof; forming a plurality of scattering patterns for scattering light by patterning the high refractive index layer disposed at the uppermost position of the insulating layer; forming at least one insulating layer covering the scattering patterns; forming a material that absorbs light on the insulating layer covering the scattering patterns; forming a plurality of light absorption portions by patterning the material that absorbs light to correspond to the scattering patterns; forming an insulating layer covering the light absorption portions; and sequentially forming a pixel electrode, an organic emission layer, and an opposite electrode on the insulating layer covering the light absorption portions.

The forming of the scattering patterns and the forming of the light absorption portions may be performed by using the same mask.

The forming of the scattering patterns may include: forming a plurality of the scattering patterns; and forming the plurality of scattering patterns to be spaced apart from one another.

The plurality of scattering patterns may be space apart from one another at constant intervals.

Each scattering pattern may be formed to have a circular shape.

DETAILED DESCRIPTION OF CERTAIN INVENTIVE EMBODIMENTS

In an organic light-emitting display, a voltage is applied between an anode and a cathode, electrons and holes combine in an organic light emission layer disposed between the anode and the cathode so that excitons are formed therein and emit light while the excitons change from an excitation state to a ground state.

An organic light-emitting display has a wide emitting wavelength range, thereby reducing luminous efficiency and reducing color purity. Since light emitted from an organic emission layer has no directivity, many photons from among photons emitted in a predetermined direction do not reach a viewer due to total internal reflection, thereby reducing extraction efficiency of an organic light-emitting device. Thus, in order to improve luminous efficiency, a resonance structure is formed in an organic light-emitting display by using a distributed Bragg reflector (DBR) mirror or by adjusting the thickness of an organic layer. However, although the resonance structure improves luminous efficiency, color shift according to a viewing angle may still occur.

Now, embodiments will be described in detail with reference to the accompanying drawings.

Figure 1:
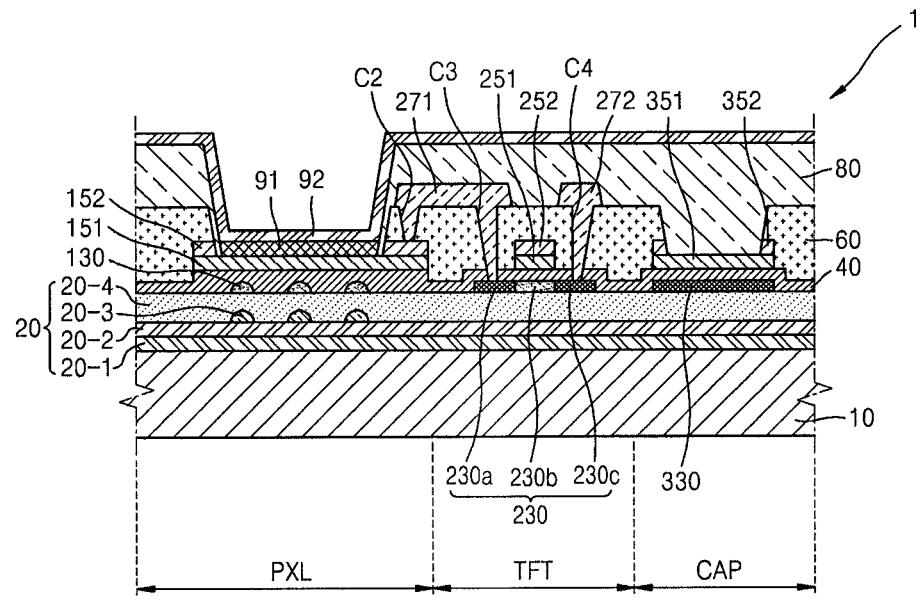
FIG. 1 is a schematic cross-sectional view of an organic light-emitting display according to an embodiment.

FIG. 1 is a schematic cross-sectional view of an organic light-emitting display 1 according to an embodiment.

Referring to FIG. 1, a light-scattering portion 20 including a plurality of insulating layers 20-1, 20-2, 20-3, and 20-4 is disposed in a pixel area PXL on a substrate 10, the insulating layer 20-3 including scattering patterns. A plurality of light absorption portions 130 are disposed on the light-scattering portion 20 to correspond to the scattering patterns of the insulating layer 20-3, and a first pixel electrode 151, an organic emission layer 91, and a opposite electrode 92 are sequentially disposed on the light absorption portions 130. In one embodiment, the light absorption portions 130 are substantially directly formed above the scattering patterns of the insulating layer 20-3.

A thin film transistor area TFT and a capacitor area CAP are disposed on a side of the pixel area PXL. The thin film transistor area TFT includes an active layer 230, a first gate electrode 251, and a second gate electrode 252, and source and drain electrodes 271 and 272 over the substrate 10 and the capacitor area CAP includes a lower electrode 330 and a first upper electrode 351 over the substrate 10.

The substrate 10 may be formed of a SiO2-based transparent glass material. The substrate 10 may be formed of any of various materials, for example, transparent plastic.

The light-scattering portion 20 includes the insulating layers 20-1, 20-2, 20-3, and 20-4 including at least a single pair of high and low refractive index layers. In the current embodiment, the light-scattering portion 20 includes four insulating layers Furthermore, a high refractive index layer is disposed at a lowermost position, and a low refractive index layer, a high refractive index layer, and a low refractive index layer are sequentially stacked on the high refractive index layer. The light-scattering portion 20 may also alternately include two or more layers having different refractive indexes. The low and high refractive index layers, which are alternately disposed, improve light extraction efficiency and a color reproduction range of the organic light-emitting display 1 by forming a distributed Bragg reflector (DBR) resonance structure.

The high and low refractive index layers denote layers having relative refractive index differences. The high refractive index layer may be formed of a material selected from the group consisting of SiNx, TiO2, Si3N4, Ta2O4, and Nb2O5, and the low refractive index layer may be formed of a siloxane-based material or SiO2. When a plurality of high refractive index layers are disposed, the high refractive index layers may be formed of the same material or different materials, which may also be applied to the low refractive index layer.

The insulating layer 20-3 includes the scattering patterns for scattering light emitted from the organic emission layer 91. The insulating layer 20-3 including the scattering patterns may be a high refractive index layer.

The organic light-emitting display 1 of the current embodiment includes the scattering patterns only in an area corresponding to the pixel area PXL. Although the insulating layer 20-3 is completely etched and thus is not in the thin film transistor area TFT and the capacitor area CAP, embodiments are not limited thereto.

There are a plurality of the scattering patterns, which may be spaced apart from one another at constant intervals, for example. Also, a scattering pattern may have a circular shape, that is, a convex shape, for example, a lens. The scattering pattern may also have a cross section having various shapes, for example, a triangular shape, a quadrangular shape, a pentagonal shape, a hexagonal shape, an octagonal shape, or the like. Although FIG. 1 illustrates three scattering patterns, four or more scattering patterns may be formed.

Light incident on the insulating layer 20-3 including the scattering patterns is diffusely reflected by the scattering patterns. Thus, color shift of light laterally emitted may be reduced.

The light-scattering portion 20 may act as a DBR resonance structure including a plurality of scattering patterns to improve light extraction efficiency and to reduce color shift due to the DBR resonance structure. Also, the light-scattering portion 20 may act as a buffer layer to prevent impurities from the substrate 10 to penetrate therethrough and to planarize a surface of the substrate 10.

The light absorption portions 130 are disposed in the pixel area PXL on the light-scattering portion 20. The light absorption portions 130 are disposed to correspond to the scattering patterns included in the light-scattering portion 20. The light absorption portions 130 may be formed of a semiconductor material such as amorphous silicon or polysilicon. The light absorption portions 130 may also be formed of any of various other materials capable of absorbing light.

A part of the light emitted from the organic emission layer 91 is incident on and absorbed into the light absorption portions 130. Accordingly, the light emitted from the organic emission layer 91 is directly incident on the scattering patterns included in the light-scattering portion 20 and passes through the substrate 10, thereby reducing an intensity of the light directly emitted to the outside. Accordingly, since only light incident on areas other than the light absorption portions 130 is not absorbed by the light absorption portions 130 and is emitted toward the light-scattering portion 20 and thus is scattered forward by the scattering patterns included in the light-scattering portion 20, the light emitted to front and side surfaces of the organic light-emitting display 1 may be substantially uniformly distributed, thereby improving a viewing angle.

An insulating layer 40 is disposed on the light-scattering portion 20 to cover the light absorption portions 130. The insulating layer 40 may include one or more materials selected from the group consisting of SiO2, SiNx, SiON, and the like. In the current embodiment, the insulating layer 40 covering the light absorption portions 130 is configured as a single layer, for example.

The first pixel electrode 151, the organic emission layer 91, and the opposite electrode 92 are sequentially disposed on the insulating layer 40.

The first pixel electrode 151 may be formed of a transparent or semi-transparent conductive material. The transparent/semi-transparent conductive material may include at least one material selected from the group consisting of indium tin oxide (ITO), indium zinc oxide (IZO), zinc oxide (ZnO), indium oxide (In2O3), indium gallium oxide (IGO), and aluminium zinc oxide (AZO). Second pixel electrodes 152 may be respectively disposed on both edge portions of the first pixel electrode 151. The second pixel electrode 152 may be formed of a metal material selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) to have a single layer structure or a multi-layered structure. The second pixel electrode 152 may protect the first pixel electrode 151 during a manufacturing process.

The organic emission layer 91 may be formed of a low molecular weight organic material or a high molecular weight organic material. When the organic emission layer 91 is formed of a low molecular organic material, a hole transport layer (HTL), a hole injection layer (HIL), an electron transport layer (ETL), and an electron injection layer (EIL) may be stacked around the organic emission layer 91, or alternatively, various other layers may be stacked when required. In this regard, examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. When the organic emission layer 91 is formed of a high molecular weight organic material, the organic emission layer 91 may further include a hole transport layer (HTL), in addition to an emissive layer (EML). The HTL may be formed of poly-(2,4)-ethylenedihydroxy thiophene (PEDOT), polyaniline (PANI), or the like. In this regard, examples of available organic materials may include a polyphenylene vinylene (PPV)-based high molecular weight organic material and a polyfluorene-based high molecular weight organic material, and the like.

The opposite electrode 92 may be a reflective electrode including a reflective material. In the current embodiment, the first pixel electrode 151 serves as an anode, and the opposite electrode 92 serves as a cathode However, the first pixel electrode 151 may also serve as a cathode, and the opposite electrode 92 may serve as an anode. The opposite electrode 92 may include one or more materials selected from the group consisting of Al, Mg, Li, Ca, LiF/Ca, and LiF/Al. Since the opposite electrode 92 is a reflective electrode, light emitted from the organic emission layer 91 is reflected by the opposite electrode 92, passes through the first pixel electrode 151 formed of a transparent/semi-transparent conductive material, and is emitted toward the substrate 10. In this regard, the DBR resonance structure included in the light-scattering portion 20 may increase light extraction efficiency and a color reproduction range of the organic light-emitting display 1. Also, as described above, color shift of the organic light-emitting display 1 may be reduced due to the light absorption portions 130 and the scattering patterns included in the light-scattering portion 20.

The active layer 230, the first and second gate electrodes 251 and 252 that are insulated from the active layer 230, and the source and drain electrodes 271 and 272 are disposed in the thin film transistor area TFT on the light-scattering portion 20.

The active layer 230 may be formed of a semiconductor material such as amorphous silicon or polysilicon, or may or may not be formed of the same material as that for forming the light absorption portion 130. When the light absorption portion 130 and the active layer 230 are formed of the same material, the light absorption portion 130 and the active layer 230 may be substantially simultaneously formed by performing the same mask process, and thus a manufacturing process may be simplified, as will be described below in detail. Impurity doped areas 230a and 230c doped with impurities are disposed at both sides of the active layer 230.

The first gate electrode 251 and the second gate electrode 252 may be respectively formed of the same materials for forming the first pixel electrode 151 and the second pixel electrode 152 on the same level.

The insulating layer 40 covering the light absorption portions 130 of the pixel area PXL is disposed between the active layer 230 and the first gate electrode 251. That is, the insulating layer 40 is disposed to cover the active layer 230 and serves as a gate insulating layer of a thin film transistor.

The source and drain electrodes 271 and 272 may be formed of one metal material selected from the group consisting of Al, Pt, Pd, Ag, Mg, Au, Ni, Nd, Ir, Cr, Li, Ca, Mo, Ti, W, and Cu to have a single layer structure or a multi-layer structure. The interlayer insulating layers 60 are disposed under the source and drain electrodes 271 and 272, and one of the source and drain electrodes 271 and 272 is connected to the second pixel electrode 152 via a via-hole C2 in the interlayer insulating layer 60, and the source and drain electrodes 271 and 272 are respectively connected to the impurity doped areas 230a and 230c of the active layer 230 via contact holes C3 and C4.

The lower electrode 330 and the first upper electrode 351 are disposed in the capacitor area CAP on the light-scattering portion 20. The lower electrode 330 may be formed of the same material as those for forming the light absorption portions 130 and the active layer 230 on the same level and may be doped with impurities.

The first upper electrode 351 may be formed of the same material as that for forming the first pixel electrode 151 on the same level, and second upper electrodes 352 formed of the same material as that for forming the second pixel electrodes 152 may be disposed on both edge portions of the first upper electrode 351.

The insulating layer 40 may be disposed between the lower electrode 330 and the first upper electrode 351 to cover the light absorption portions 130. The insulating layer 40 serves as a dielectric layer of a capacitor. In this regard, an electric capacitance of the capacitor is determined according to a permittivity, an area, and a thickness of the insulating layer 40. Accordingly, the electric capacitance of the capacitor may be controlled by controlling the thickness of the insulating layer 40.

FIGS. 2 to 9 are cross-sectional views sequentially illustrating a method of manufacturing the organic light-emitting display 1 of FIG. 1, according to an embodiment.

Figure 2:
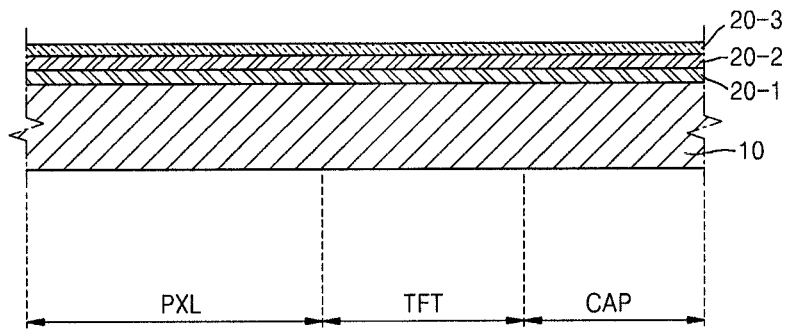
FIGS. 2 to 9 are cross-sectional views sequentially illustrating a method of manufacturing the organic light-emitting display of FIG. 1, according to an embodiment.

Referring to FIG. 2, the insulating layers 20-1, 20-2, and 20-3 having different refractive indexes are formed on the substrate 10. The current embodiment includes three insulating layers 20-1, 20-2, and 20-3, for example. From among the insulating layers 20-1, 20-2, and 20-3, the insulating layer 20-3 disposed at the uppermost position may be a high refractive index layer.

Figure 3:
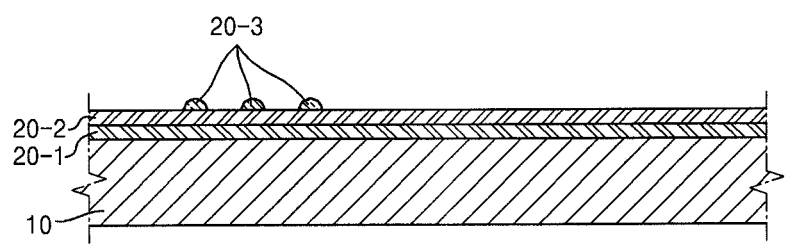

Referring to FIG. 3, scattering patterns are formed in the insulating layer 20-3 disposed at the uppermost position. Although FIG. 3 does not illustrate a manufacturing process in detail, a photoresist (not shown) is coated on the insulating layer 20-3, and then the insulating layer 20-3 is patterned using a photolithography process using a first mask (not shown). A first mask process is performed by performing a series of processes, for example, exposing of the first mask by using an exposing apparatus (not shown), developing, etching, and stripping or ashing. Hereinafter, the same description regarding a subsequent mask process will be omitted.

In the current embodiment, the scattering patterns are formed only in an area corresponding to the pixel area PXL, the insulating layer 20-3 is completely etched in the thin film transistor area TFT and the capacitor area CAP, and the scattering patterns formed in the pixel area PXL are separated from one another.

There are a plurality of the scattering patterns, which may be spaced apart from one another at constant intervals. Also, the scattering pattern may have a circular shape, that is, a convex shape, for example, a lens. In order to form the scattering pattern in a circular shape, the above-described first mask process is performed on the scattering pattern and then heat may be additionally applied thereto.

Figure 4:
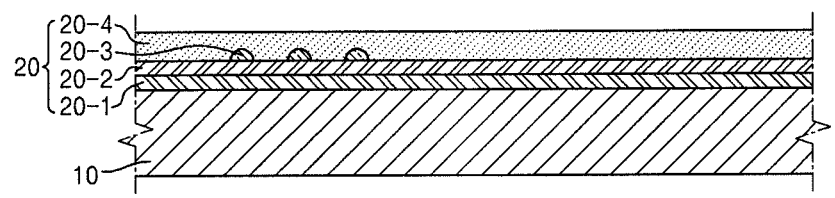

Referring to FIG. 4, the insulating layer 20-4 may be additionally formed to cover the scattering patterns. The insulating layer 20-4 may be a low refractive index layer and may be configured as a multi-layer including a low refractive index layer.

Figure 5:
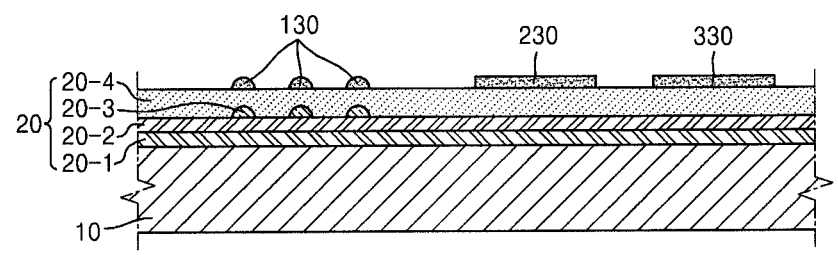

Referring to FIG. 5, the light absorption portions 130 are formed by performing a second mask process in the pixel area PXL on the light-scattering portion 20 including the plurality of insulating layers 20-1, 20-2, 20-3, and 20-4, the active layer 230 is formed in the thin film transistor area TFT, and the lower electrode 330 is formed in the capacitor area CAP. The light absorption portions 130 are formed to correspond to the scattering patterns included in the light-scattering portion 20.

The light absorption portions 130, the active layer 230, and the lower electrode 330 may be formed of the same material on the same level. The same material may be a semiconductor material such as amorphous silicon or polysilicon. The semiconductor material may be deposited on the light-scattering portion 20 by using any of various deposition methods, for example, a plasma-enhanced chemical vapor deposition (PECVD) method, an atmospheric pressure CVD (APCVE) method, a low pressure CVD (LPCVD), or the like. The light absorption portions 130, the active layer 230, and the lower electrode 330 may be simultaneously formed by performing the second mask process on the deposited semiconductor material. However, the light absorption portion 130 may also be formed of any material capable of absorbing light and may be separately formed from the active layer 230 and the lower electrode 330.

Figure 6:
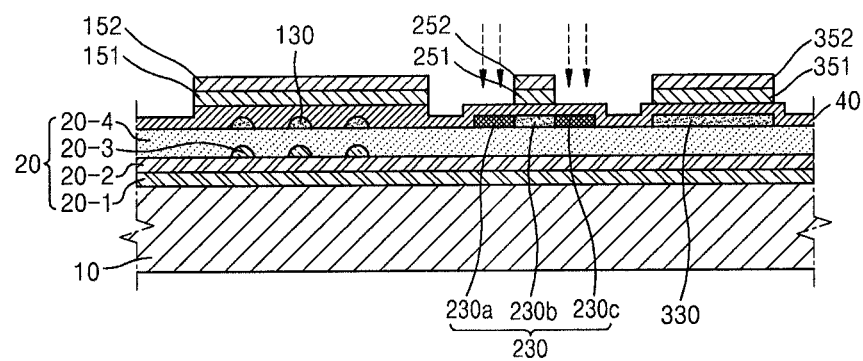

Referring to FIG. 6, the insulating layer 40 is formed throughout the organic light-emitting display 1 so as to cover the light absorption portions 130, the active layer 230, and the lower electrode 330, and a transparent conductive material and a metal material are sequentially deposited on the insulating layer 40. Then, the first and second pixel electrodes 151 and 152, the first and second gate electrodes 251 and 252, and the first and second upper electrodes 351 and 352 are simultaneously formed in the pixel area PXL, the thin film transistor area TFT, and the capacitor area CAP by performing a third mask process, respectively.

The insulating layer 40 may include one or more materials selected from the group consisting of SiO2, SiNx, SiON, and the like and may serve as a gate insulating layer of a thin film transistor and a dielectric layer of a capacitor. The insulating layer 40 may be configured as a single-layer or a multi-layer structure.

The first gate electrode 251 and the second gate electrode 252 may be formed to correspond to a center portion 230b of the active layer 230. Both edge portions of the active layer 230 are doped with ion impurities by using the first and second gate electrodes 251 and 252 as self-aligned masks.

Figure 7:
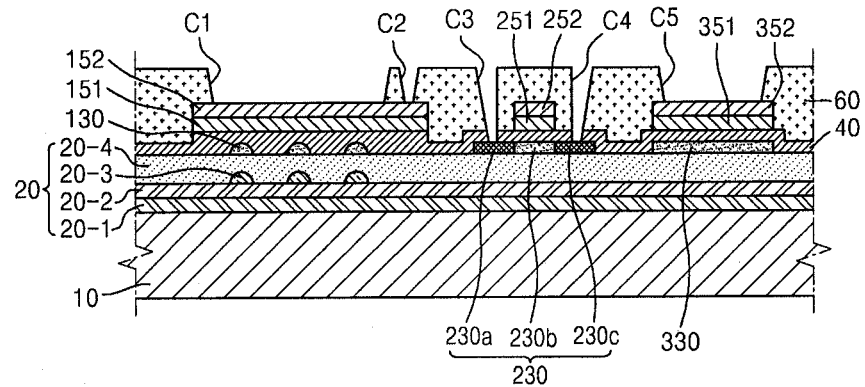

Referring to FIG. 7, the interlayer insulating layer 60 is formed on a resultant of the third mask process performed in FIG. 6. Then, a first opening C1 and a via-hole C2 exposing the second pixel electrode 152, the contact holes C3 and C4 partially exposing the impurity doped areas 230a and 230c of the active layer 230, and a second opening C5 exposing the second upper electrode 352 of the capacitor are formed by patterning the interlayer insulating layer 60 by performing a fourth mask process.

Figure 8:
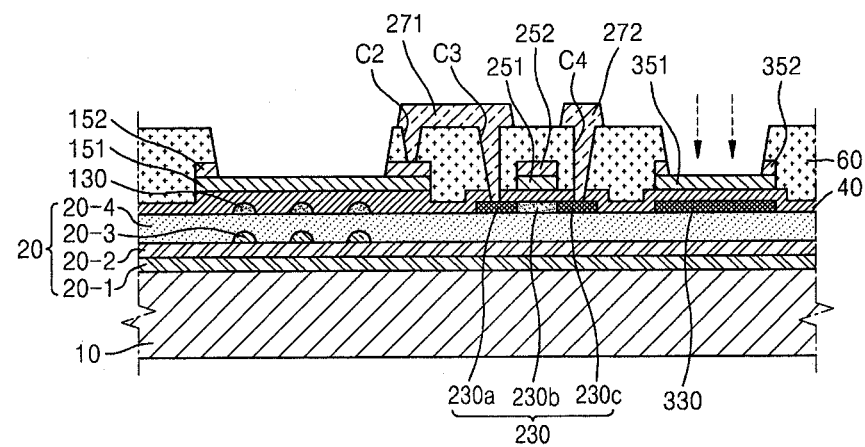

Referring to FIG. 8, the source and drain electrodes 271 and 272 are formed on the interlayer insulating layer 60 by performing a fifth mask process.

One of the source and drain electrodes 271 and 272 is connected to the second pixel electrode 152 via the via-hole C2, and the source and drain electrodes 271 and 272 are connected to the impurity doped areas 230a and 230c of the active layer 230 via the contact holes C3 and C4, respectively.

When the source and drain electrodes 271 and 272 are formed, the second pixel electrode 152 and the second upper electrode 352 are etched at the same time. The forming of the source and drain electrodes 271 and 272 and the etching of the second pixel electrode 152 and the second upper electrode 352 may be substantially simultaneously performed by using the same etchant or may be sequentially performed by using different etchants.

After the etching is performed, the lower electrode 330 of the capacitor is doped with ion impurities.

Figure 9:
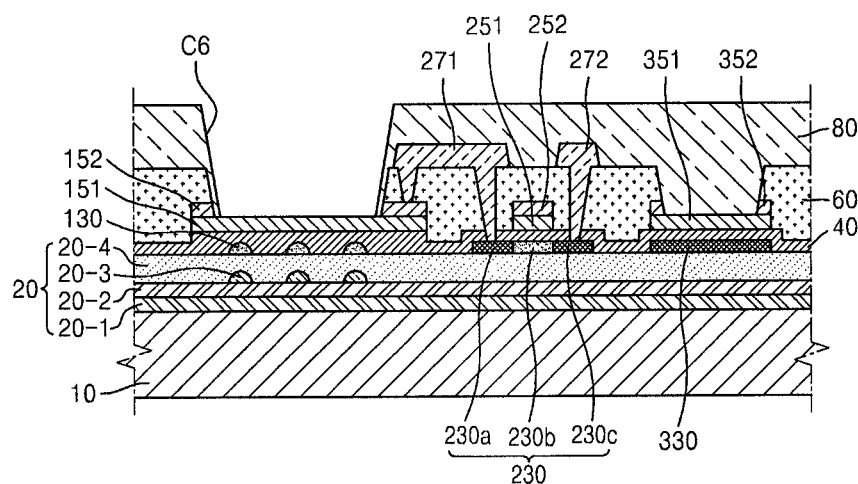

Referring to FIG. 9, a pixel-defining layer 80 for defining the pixel area PXL is formed on a resultant of the fifth mask process performed in FIG. 7, and the pixel-defining layer 80 is partially etched by performing a sixth mask process, thereby forming a third opening C6 exposing a part of the first pixel electrode 151.

The organic emission layer 91 and the opposite electrode 92 are deposited on the first pixel electrode 151 exposed by the third opening C6, thereby completing the manufacture of the organic light-emitting display 1 illustrated in FIG. 1. In this regard, the opposite electrode 92, which is a common electrode, may be formed throughout the organic light-emitting display 1.

Figure 10:
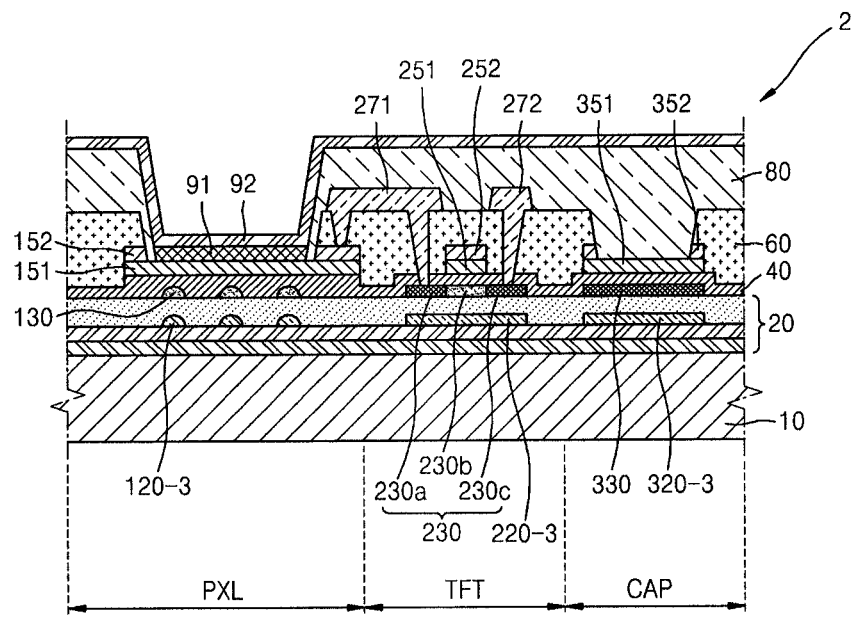
FIG. 10 is a schematic cross-sectional view of an organic light-emitting display according to another embodiment.

FIG. 10 is a schematic cross-sectional view of an organic light-emitting display 2 1 according to another embodiment. Hereinafter, differences between the current embodiment and the above-described embodiment will be mainly described.

Referring to FIG. 10, a light-scattering portion 20 includes in a pixel area PXL a plurality of patterns 120-3 scattering light emitted from an organic emission layer 91, a pattern 220-3 formed in a thin film transistor area TFT similarly to an active layer 230, and a pattern 320-3 formed in a capacitor area CAP similarly to a lower electrode 330.

The patterns 120-3, 220-3, and 320-3 formed in the light-scattering portion 20 are formed similarly to light absorption portions 130, the active layer 230, and the lower electrode 330. Accordingly, a first mask process for patterning the light-scattering portion 20 and a second mask process for forming the light absorption portions 130, the active layer 230, and the lower electrode 330 may be performed by using the same mask. Thus, in the current embodiment, the number of masks used in a process for manufacturing the organic light-emitting display 2 may be reduced, and the patterns 120-3 and the light absorption portions 130 formed in the pixel area PXL may be easily formed to correspond to each other.

Figure 11:
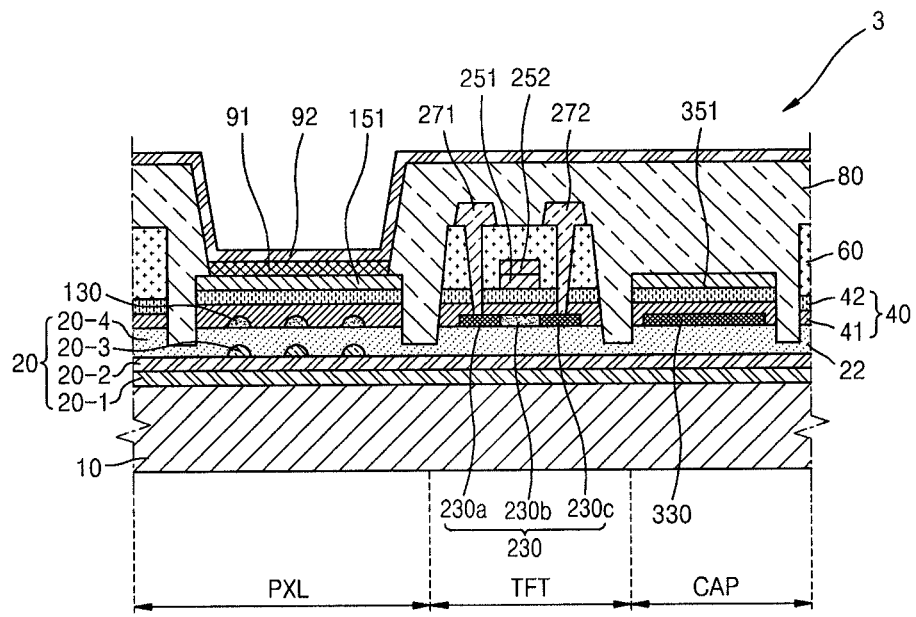
FIG. 11 is a schematic cross-sectional view of an organic light-emitting display according to another embodiment.

FIG. 11 is a schematic cross-sectional view of an organic light-emitting display 3 according to another embodiment.

In the organic light-emitting display 3 according to the current embodiment, an insulating layer 40, which is formed to cover light absorption portions 130, an active layer 230, and a lower electrode 330 of a capacitor, includes two layers, namely, a lower insulating layer 41 and an upper insulating layer 42. The lower insulating layer 41 may be a low refractive index layer formed of a siloxane-based material or SiO2, and the upper insulating layer 42 may be a high refractive index layer formed of one material selected from the group consisting of SiNx, TiO2, Si3N4, Ta2O4, and Nb2O5.

However, the insulating layer 40 may include three or more layers, and various materials for forming the low refractive index layer and the high refractive index layer may be used. Alternatively, the materials for forming the low and high refractive index layers may be the same as those for forming the low refractive index layer and the high refractive index layer included in the light-scattering portion 20. However, since the lower insulating layer 41 directly contacts the active layer 230, the lower insulating layer 41 may be formed to have a hydrogen content lower than that in the upper insulating layer 42.

The insulating layer 40 includes the high and low refractive index layers formed alternately, so that the insulating layer 40 and the light-scattering portion 20 together may form a DBR resonance structure, thereby further increasing light extraction efficiency and a color reproduction range of the organic light-emitting display 3.

However, since the insulating layer 40 serves as a dielectric layer in the capacitor area CAP, the insulating layer 40 may be formed not too thick so that the capacitance of the capacitor is not excessively decreased.

Also, in the organic light-emitting display 1 illustrated in FIG. 1, the interlayer insulating layer 60 is formed to cover both edge portions of the first pixel electrode 151 and both edge portions of the first upper electrode 351 of the capacitor, while in the organic light-emitting display 3, the interlayer insulating layer 60 is patterned not to cover a first pixel electrode 151 and a first upper electrode 351 of a capacitor. During an etching process for patterning the interlayer insulating layer 60, the insulating layer 40 covering the light absorption portions 130 and a part of the light-scattering portion 20 may be simultaneously etched.

According to the configuration of the organic light-emitting display 3, an aperture ratio of the pixel area PXL is increased, thereby increasing an area where light is emitted, and the lower electrode 330 of the capacitor is not influenced by the interlayer insulating layer 60, and thus the organic light-emitting display 3 may be entirely doped with ions.

Figure 12:
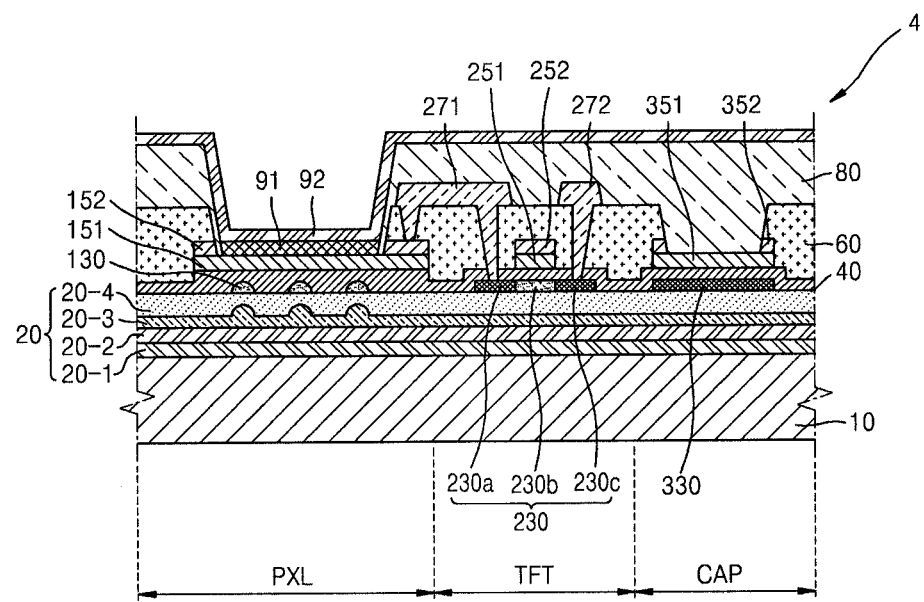
FIG. 12 is a schematic cross-sectional view of an organic light-emitting display according to another embodiment.

FIG. 12 is a schematic cross-sectional view of an organic light-emitting display 4 according to another embodiment.

Referring to FIG. 12, the organic light-emitting display 4 has the same configuration as that of the organic light-emitting display 1 illustrated in FIG. 1, except for a patterned insulating layer 20-3 included in a light-scattering portion 20. The insulating layer 20-3 illustrated in FIG. 1 is disposed only in the pixel area PXL and includes the scattering patterns spaced apart from one another, while the insulating layer 20-3 of the current embodiment includes convex patterns formed on a flat area to be spaced apart from one another. The flat area of the insulating layer 20-3 extends to a thin film transistor area TFT and a capacitor area CAP.

Light incident on the insulating layer 20-3 is scattered in an area where the convex patterns are disposed and is reflected or permeates in the other areas according to a general condition.

According to the above-described organic light-emitting displays and the method of manufacturing the displays, color shift according to a viewing angle can be reduced by applying a resonance structure including a plurality of scattering patterns.

While the above embodiments have been described with reference to the accompanying drawings, it will be understood by those of ordinary skill in the art that various changes in form and details may be made therein without departing from the spirit and scope of the following claims.

What is claimed is:

1. A method of manufacturing an organic light-emitting display, the method comprising:
    forming, over a substrate, a plurality of insulating layers which comprise at least one pair of high and low refractive index layers, wherein a high refractive index layer is formed at the uppermost position of the insulating layers;
    patterning the uppermost high refractive index layer so as to form a plurality of scattering patterns which are configured to scatter light;
    forming at least one first insulating layer which covers the scattering patterns;
    forming a light absorption layer on the first insulating layer;
    patterning the light absorption layer so as to form a plurality of light absorption portions which correspond to the scattering patterns, respectively;
    forming a second insulating layer which covers the light absorption portions; and
    sequentially forming a pixel electrode, an organic emission layer, and an opposite electrode on the second insulating layer,
    wherein the patterning of the uppermost high refractive index layer and the patterning of the light absorption layer are performed with the use of the same mask.

2. The method of claim 1, wherein the scattering patterns are substantially evenly spaced apart from one another.

3. The method of claim 1, wherein each of the scattering patterns has a circular shape.

* * * * *